US009036233B2

(12) United States Patent
Sato et al.

(10) Patent No.: US 9,036,233 B2
(45) Date of Patent: May 19, 2015

(54) LASER LIGHT SOURCE MODULE

(71) Applicant: Hitachi Media Electronics Co., Ltd., Oshu-shi, Iwate (JP)

(72) Inventors: Wataru Sato, Hitachinaka (JP); Takeshi Nakao, Sagamihara (JP)

(73) Assignee: HITACHI-LG DATA STORAGE, INC., Tokyo (JP)

( * ) Notice: Subject to any disclaimer, the term of this patent is extended or adjusted under 35 U.S.C. 154(b) by 222 days.

(21) Appl. No.: 13/779,946

(22) Filed: Feb. 28, 2013

(65) Prior Publication Data
US 2013/0222876 A1  Aug. 29, 2013

(30) Foreign Application Priority Data

Feb. 28, 2012 (JP) ................................ 2012-041070

(51) Int. Cl.
| | |
|---|---|
| *G02B 26/08* | (2006.01) |
| *H01S 3/04* | (2006.01) |
| *H01S 5/40* | (2006.01) |
| *H04N 9/31* | (2006.01) |
| *H01S 5/02* | (2006.01) |
| *H01S 5/024* | (2006.01) |

(52) U.S. Cl.
CPC .................. *H01S 3/0405* (2013.01); *H01S 5/02* (2013.01); *H01S 5/02469* (2013.01); *H01S 5/4012* (2013.01); *H01S 5/4093* (2013.01); *H04N 9/3129* (2013.01)

(58) Field of Classification Search
CPC ........... G02B 21/0016; G02B 26/0841; G02B 26/0858; G02B 26/105; G02B 17/02; G02B 17/08; G02B 17/0888; G02B 26/02; G02B 7/02; G02B 7/34; H04N 9/3129; H01S 3/0405; H01S 5/02; H01S 5/02469; H01S 5/4012; H01S 5/4093
USPC ........ 359/212.1–221.1, 223.1–226.2; 372/36; 353/31, 37, 52
See application file for complete search history.

(56) References Cited

U.S. PATENT DOCUMENTS

2003/0180010 A1  9/2003 Minamino et al.
2012/0062851 A1* 3/2012 Yoshimoto et al. ............. 353/31

FOREIGN PATENT DOCUMENTS

| JP | 2003-273438 | 9/2003 |
|---|---|---|
| JP | 2009-204692 | 9/2009 |
| WO | WO 2012/176487 | * 12/2012 |

* cited by examiner

*Primary Examiner* — James Phan
(74) *Attorney, Agent, or Firm* — Baker Botts L.L.P.

(57) ABSTRACT

A laser light source module includes a housing and a heat sink that is thermally connected to the housing. The housing includes a laser element that emits laser light, a laser holder that is made of metal to hold the laser element, a laser light receiving element that receives laser beam from the laser element, a mirror element that reflects the laser light to scan a screen, an optical element that is disposed on the optical axis of the laser light. The laser holder is thermally connected to the housing with a thermally conductive member. A protrusion is formed on the thermally conductive member. The protrusion and the springiness of the thermally conductive member are used to press the laser holder against the housing in the same direction as the direction of laser light emission.

6 Claims, 4 Drawing Sheets

LASER LIGHT SOURCE MODULE

FIELD OF THE INVENTION

The present invention relates to a laser light source module that makes an image in a display by scanning laser light in a two-dimensional manner with a scan mirror.

CLAIM OF PRIORITY

The present application claims priority from Japanese patent application serial No. 2012-041070 filed on Feb. 28, 2012, the content of which is hereby incorporated by reference into this application.

BACKGROUND OF THE INVENTION

The laser light source module is mounted in a scanning display device. This scanning display device operates so that laser light, which is formed by combining several laser beams emitted from a laser element, is two-dimensionally scanned on a screen with a mirror element to display an image. This type of display device is demanded to increase the brightness of the image to be displayed. Hence, it is necessary to increase a laser output. However, if an attempt is made to increase the laser output, the temperature of each laser element significantly rises.

If the laser element temperature rises, the oscillation wavelength of each laser element changes to reduce image quality and shorten the life thereof. This degrades the performance of the laser light source module. Hence, it is important that an appropriate structure be employed to increase the heat dissipation of the laser element.

In general, the laser element is combined with a thermoelectric cooling element and a small-size fan to present an excessive temperature rise in the laser element. On the other hand, a laser light source module mounted in a small-size scanning display device, is demanded to reduce its power consumption because it is battery-driven.

As such being the case, the electrical power used for cooling needs to be reduced. Thus, a structure for thermally connecting the laser element to a heat diffusing base is being studied as it reduces the temperature rise in the laser element without using electrical power for cooling.

For example, Japanese Unexamined Patent Application Publication No. 2009-204692 discloses that a thermally conductive member is connected between a metal housing and an LED, which is a light source for a display device, to increase the area of heat dissipation.

Meanwhile, Japanese Unexamined Patent Application Publication No. 2003-273438 discloses that leads of an optical module are disposed on a lateral surface of the optical module to bring a bottom surface of the optical module in contact with a heat diffusing base as a heat sink. This structure ensures that the heat of the optical module is easily transferred to the heat diffusing base.

The above-mentioned related arts can prevent an excessive temperature rise in the laser element by thermally connecting the heat sink to an LED or each laser element that acts as a heat source. However, in a laser light source module comprising several laser elements as a light source for a display device, several laser beams need to be accurately combined to each other.

The reason is that an image cannot be accurately displayed if the light beam emitted from any laser element deviates from an appropriate direction. Therefore, it is necessary to employ a structure that inhibits a deviation of an optical axis. According to the above-mentioned related arts, the thermally conductive member is disposed in a direction perpendicular to the optical axis. Consequently, when the above-mentioned related arts are employed, the optical axis is deviated from the appropriate direction because of deformation caused by a temperature rise in the thermally conductive member.

The present invention has been made in view of the above circumstances and provides a highly reliable laser light source module that is structured to not only prevent an excessive temperature rise in a laser element but also inhibit a deviation of an optical axis of laser light caused by a temperature rise.

SUMMARY OF THE INVENTION

In a first aspect of the present invention, there is provided a laser light source module including a housing and a heat sink. The housing includes a laser element, a laser holder, a laser light receiving element, a mirror element, and an optical element. The laser element emits laser light. The laser holder is made of metal to hold the laser element. The laser light receiving element receives laser light from the laser element. The mirror element reflects the laser light to scan a screen. The optical element is disposed on an optical axis of the laser light. The heat sink is thermally connected to the housing. The laser holder is thermally connected to the housing through a thermally conductive member having springness. A protrusion is formed on the thermally conductive member or the laser holder. The protrusion and the springness of the thermally conductive member are used to press the laser holder against the housing in the same direction as the laser light emission direction.

In a second aspect of the present invention, there is provided the laser light source module as described in the first aspect, further including a hook provided on one end of the thermally conductive member and a slot provided on the housing, wherein the hook engages into the slot.

In a third aspect of the present invention, there is provided the laser light source module as described in the first aspect, wherein one end of the thermally conductive member engages with the heat sink.

According to the present invention, it can provide a highly reliable laser light source module that is structured to not only prevent an excessive temperature rise in a laser element but also inhibit a deviation of an optical axis of laser light caused by a temperature rise.

DETAILED DESCRIPTION OF THE PREFERRED EMBODIMENTS

A scanning display device is a mobile small-size image output device that is capable of projecting an image onto a screen at anytime and any place when everyone wants to look the image picked up with a cell phone together at once, for instance. As cell phones equipped with a high image quality digital camera are widespread, it is expected that the scanning display device will enjoy an increasing demand in the future.

As is the case with a projection image display device, the scanning display device includes R, G, and B light sources. As the R, G, and B light sources simultaneously emit light together, they generate a significant amount of heat. Further, the brightness levels of the R, G, and B light sources need to be raised in order to reproduce a clear image. When such brightness levels are raised, a large amount of heat is generated. However, the scanning display device, which mainly features its compactness, does not have a space for mounting a light source cooling fan. In addition, a battery acting as a driving source of the scanning display device does not have a capacity for operating the fan.

As such being the case, it is preferred that the scanning display device efficiently diffuse the heat of the light sources by transferring it from a housing to a heat sink. For such heat diffusion, for example, thermally conductive grease may be applied between a laser holder and the heat sink as is generally practiced. However, if, in such an instance, the applied grease is improperly balanced, its thickness is in error resulting in displacements of the optical axis of any light source and resulting in reproduction of a low-quality image. Further, if screws are used to provide improved contact between the laser holder and the heat sink, the force of screw tightening may be in error resulting in displacements of the optical axis.

Under the above circumstances, the inventors of the present invention have studied various structures for pressing the heat sink against the laser holder uniformly in the direction of the optical axis and come up with the following embodiments.

The embodiments of the present invention will be described below with reference to the accompanying drawings.

First Embodiment

A first embodiment of the present invention will now be described in detail with reference to the accompanying drawings.

Figure 1:
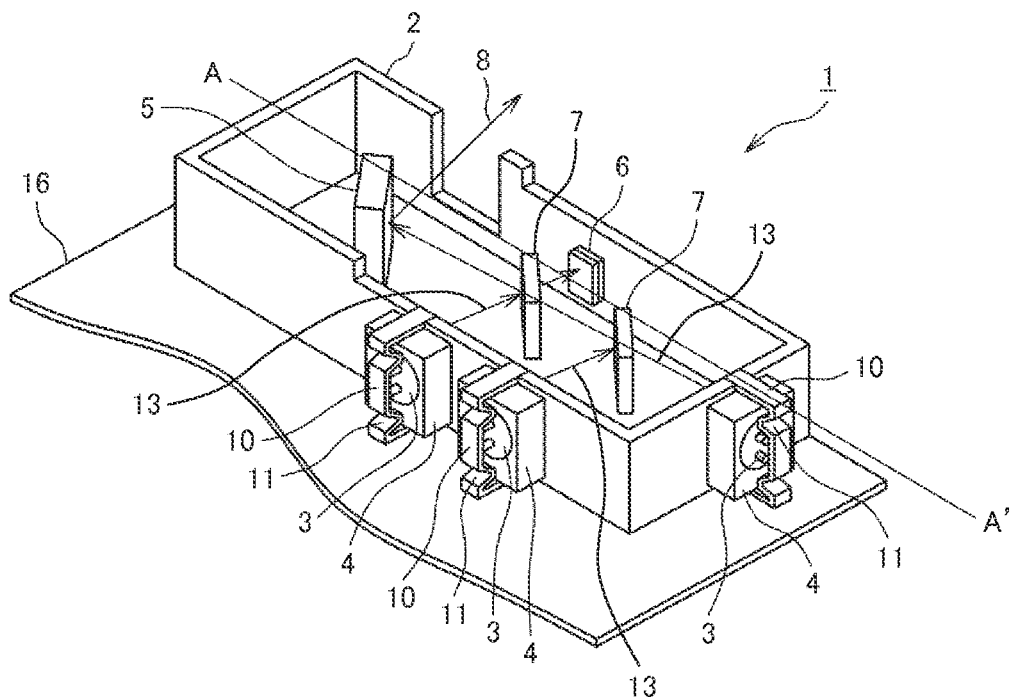
FIG. 1 is a schematic perspective view illustrating a laser light source module according to a first embodiment of the present invention.

FIG. 1 is a schematic perspective view illustrating a laser light source module according to the first embodiment.

Referring to FIG. 1, three laser elements 3 as RGB elements, which emit laser beams respectively, are mounted in a laser light source module 1. Each of the three laser elements 3 is hold by a laser holder 4.

Figure 2:
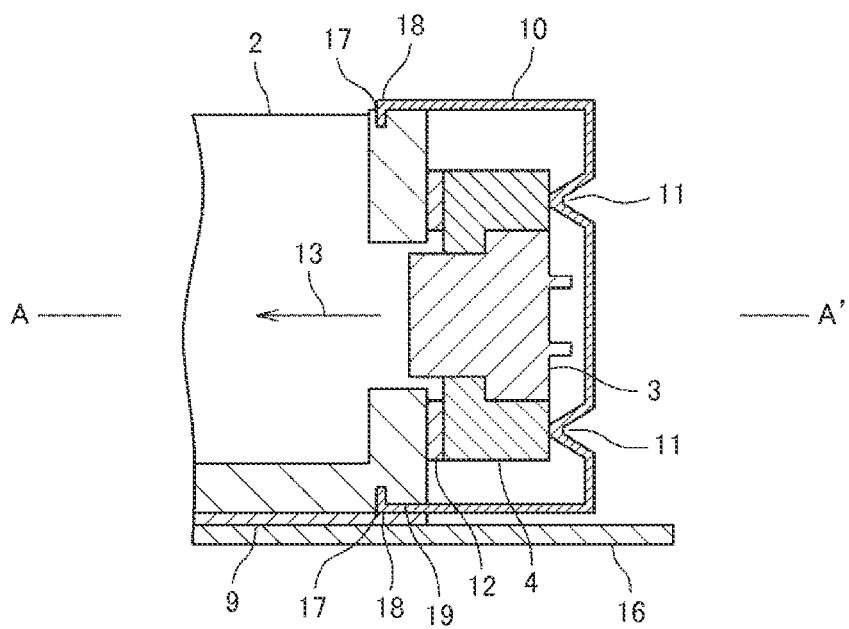
FIG. 2 is a schematic cross-sectional view illustrating a part of cross section taken along line A-A' of FIG. 1.

Each laser holder 4 is fixed to a housing 2 with an adhesive 12 (shown in FIG. 2). A scan mirror 5 scans a laser light 8 (shown in FIG. 2), which is emitted from the laser light source module 1, on a screen (not shown). Two mirrors 7 combines three laser beams 13 emitted from the respective laser elements 3 and directs the combined laser beams 13 (hereafter, it's collected as laser light 8) to the scan mirror 5. A photoreceptor 6 is fixed by the housing 2. A thermally conductive member 10 thermally connects the laser holder 4 to the housing 2.

The laser elements 3 emits a red (R) laser beam, a green (G) laser beam, and a blue (B) laser beam, respectively. The scan mirror 5 is configured, for example, by a MEMS (Micro Electro Mechanical System) mirror that rotates a mirror surface so that the laser light 8 emitted from the laser elements 3 is two-dimensionally scanned on a screen. The housing 2 is thermally connected to a heat sink 16 through thermally conductive grease 9 (shown in FIG. 2) in order to reduce a temperature rise in the laser element 3. Reference numeral 11 denotes a protrusion for use in connection to the laser holder and same protrusion are provided to the thermally conductive member 10, as mentioned later.

Each component is made of an appropriate material, for example, the housing 2 and the laser holder 4 may be constructed of a magnesium die casting, a zinc die casting, or an aluminum die casting. It is preferred that the thermally conductive member 10 has a high thermal conductivity and excels in springiness to be pressed against the laser holder. Therefore, the thermally conductive member 10 should be made, for instance, of copper or aluminum. It is preferred that the heat sink 16 has a larger surface area than a bottom area of the housing 2 to diffuse the heat from the housing 2 and has a high thermal conductivity. Therefore, the heat sink 16 may be, for example, constructed of a metal plate made of such a copper plate or an aluminum plate or a thermally conductive sheet such as a graphite sheet.

An image display method employed by the laser light source module 1 will now be described.

The laser beams 13 emitted from the R, G, and B laser elements 3 are combined by the mirror 7 resulting in the laser light 8, and the laser light 8 is incident on the scan mirror 5. The scan mirror 5 is driven with a rotary motion so that the laser light 8 reflects on the scan mirror to be two-dimensionally scanned on the screen (not shown). In this instance, a two-dimensional color image is formed by synchronizing modulations of the R, G, and B laser elements 3.

FIG. 2 is a schematic cross-sectional view illustrating a part of cross section taken along line A-A' of FIG. 1.

Referring to FIG. 2, each laser element 3 is fixed to the laser holder 4 which is adhered to the housing 2 with the adhesive 12. Both ends of the thermally conductive member 10 are provided with hooks 18, respectively. Each hook 18 engages with a slot 17 provided on the housing 2. A groove 19 is provided on the bottom surface of the housing 2 to fit a part of the thermally conductive member 10 thereinto. The depth of the groove 19 is specified such that the bottom surface of the housing 2 is substantially flush with the thermally conductive member 10. The thermally conductive grease 9 is applied between the housing 2 and the thermally conductive member 10.

Each protrusion 11 is comprised of a part of the thermally conductive member 10, which is directed toward the laser holder 4. The protrusion 11 is formed integrally with the thermally conductive member 10 by sheet-metal pres working. The thermally conductive member 10 is made of an elastic metal plate. Because of the elasticity of the thermally conductive member 10, each hook 18 of the thermally conductive member 10 engages into the slot 17 formed on the housing 2 without using any adhesive. This brings the protrusions 11 into contact with the laser holder 4, and each of the protrusions are pressed against the laser holder 4 in the direction of laser light emission.

More specifically, when the thermally conductive member 10 is to be fixed to the housing 2 by pressing the conductive member in the housing 2, the two protrusions 11 provided to the thermally conductive member 10 are pressed against the surface of the laser holder 4. Further, when the thermally conductive member 10 is pressed in the housing 2, each hook 18 engages into the slot 17 because the thermally conductive member 10 has springness. Each laser element 3 fixed as described above is pressed in an emission direction of laser beam 13 by the springiness of the thermally conductive member 10 and by the two protrusions 11. This prevents an optical axis from being deviated from the appropriate direction thereof. Further, the heat of the laser element 3 is transferred from the protrusions 11 pressed against the laser holder 4 to the thermally conductive member 10, further transferred from the hooks 18 to the housing 2, and released from the heat sink 16 to the atmosphere.

In the present embodiment, it is assumed that the two protrusions 11 on the thermally conductive member is pressed against the laser holder 4 at two points. Alternatively, however, the two protrusions 11 may be pressed against the laser holder 4 at three points instead of two points. However, it is preferred that the center of gravity of the contact of the two protrusions 11 be in alignment with the direction of laser light emission. Further, both ends of the thermally conductive member 10 need not always be fixed to the housing 2 with the hooks 18 on the thermally conductive member 10. Alternatively, they may be fixed with screws or adhesive. Furthermore, the thermally conductive member 10 need not always be provided for all the three (R, G, and B) laser elements 3. Alternatively, the thermally conductive member 10 may be provided only for a laser element 3 that generates a large amount of heat.

Figure 3:
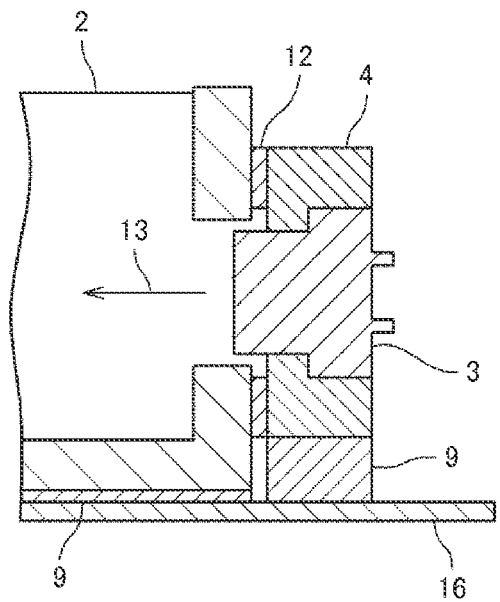
FIG. 3 is a schematic cross-sectional view illustrating a laser holder fixing portion according to a related art.

FIG. 3 shows the laser light source module 1 having a related-art structure and is a schematic cross-sectional view illustrating the same cross section as cross section A-A' of FIG. 1. The heat dissipation path of the laser element 3 is shown in FIG. 3 as a related-art example. The heat dissipation path of the related-art laser light source module 1 will now be described.

Referring to FIG. 3, the related-art structure is such that the heat generated by the laser element 3 is transferred to the housing 2 through the adhesive 12. The heat transferred to the housing 2 is transferred to the heat sink 16 through the thermally conductive grease 9, diffused by the heat sink 16, and finally released to the air. Further, the thermally conductive grease 9 is filled between the laser holder 4 and the heat sink 16 so that the heat is readily transferred from the laser holder 4 to the heat sink 16.

However, the adhesive 12 and the thermally conductive grease 9 have a lower thermal conductivity than the metal laser holder 4 and the housing 2. Therefore, the heat is not readily transferred to the housing 2 and to the heat sink 16 so that the temperature of the laser element 3 is likely to rise. Further, when the laser element 3 and the laser holder 4 increase in temperature, the temperature of the thermally conductive grease 9 rises. This expands the thermally conductive grease 9 to cause deformation, thereby pushing the laser holder 4 upward. Hence, the direction of laser light emission is tilted to displace three-color laser light spots from each other. This results in the failure to display an accurate image.

Meanwhile, the laser light source module 1 according to the first embodiment is configured so that the thermally conductive member 10 having a high thermal conductivity is thermally connected between the laser holder 4 and the housing 2. Therefore, the heat is readily transferred to the housing 2 so that the temperature rise in the laser element 3 can be reduced. Further, as the thermally conductive member 10 is substantially flush with the bottom surface of the housing 2, the layer of the thermally conductive grease 9 filled between the housing 2 and the heat sink 16 can be thinned. This ensures that the heat is readily transferred from the housing 2 to the heat sink 16.

Furthermore, the thermally conductive grease 9 need not be filled between the laser holder 4 and the heat sink 16 and the thermally conductive member 10 presses the laser holder 4 in the same direction as the direction of laser light emission 13. This makes it possible to inhibit the direction of laser light emission from being tilted by the temperature rise in the laser element 3. As a result, a highly reliable laser light source module can be provided.

Moreover, the thermally conductive member 10 has springness. Therefore, even if the thickness of the adhesive 12 and the position of the laser holder 4 vary when the laser light source module 1 is assembled, the laser holder 4 can be pressed in the direction of laser light emission 13. As a result, the laser light source module 1 can be structured so as to facilitate its assembly.

Second Embodiment

Figure 4:
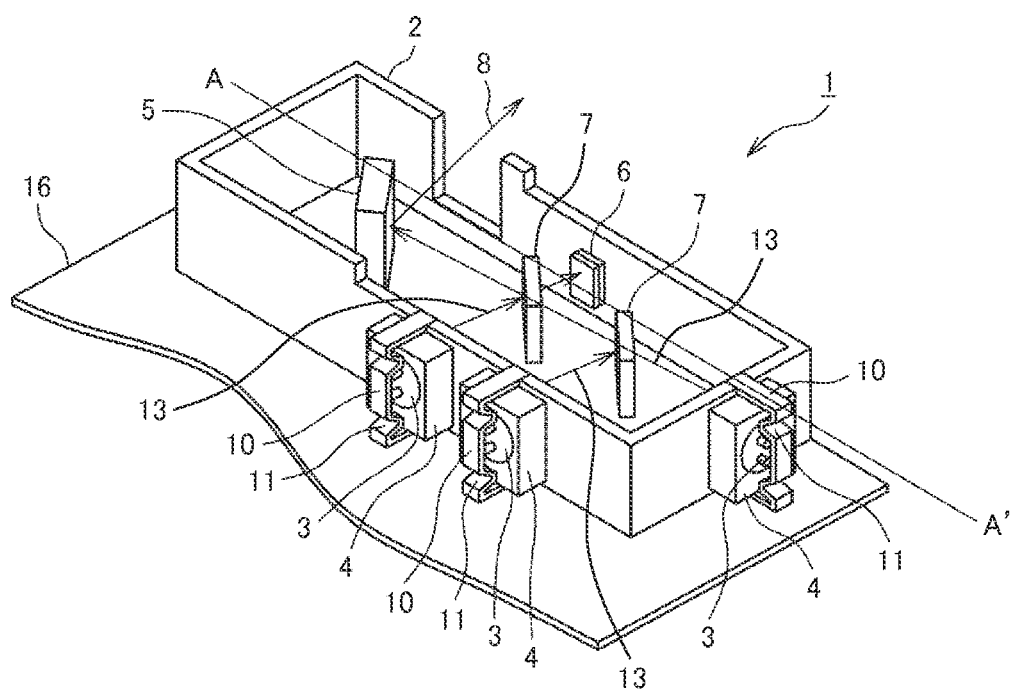
FIG. 4 is a schematic perspective view illustrating the laser light source module according to a second embodiment of the present invention.

FIG. 4 is a schematic perspective view illustrating the laser light source module according to a second embodiment of the present invention.

Figure 5:
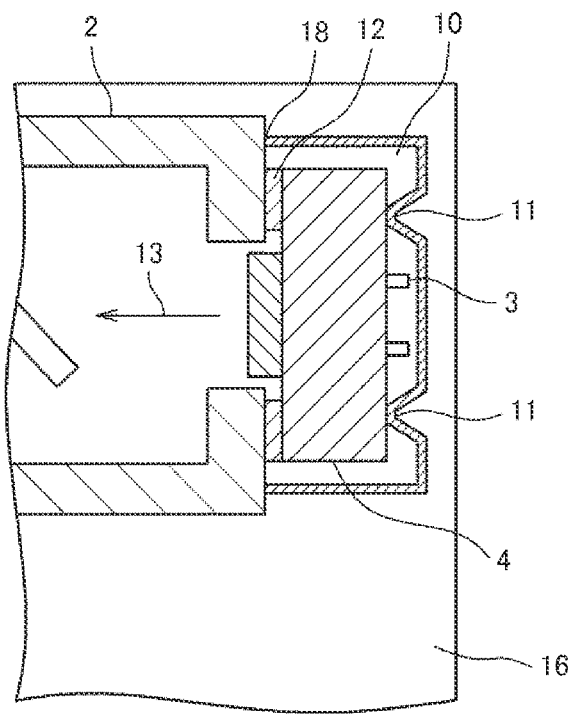
FIG. 5 is a schematic top view illustrating the laser holder fixing portion of the laser light source module according to the second embodiment.

FIG. 5 is a schematic top view illustrating a laser holder fixing portion of the laser light source module according to the second embodiment.

Referring to FIGS. 4 and 5, the second embodiment is similar to the first embodiment in that three laser elements 3, which emit laser beams respectively, are mounted in the laser light source module 1. Each of the three laser elements 3 is hold by the laser holder 4.

The laser holder 4 is fixed to the housing 2 with the adhesive 12 (shown in FIG. 5). The scan mirror 5 scans laser light 8, which is emitted from the laser light source module 1, on a screen (not shown). The mirror 7 directs the laser light 8 to the scan mirror 5. The light receiving element 6 is fixed by the housing 2. The thermally conductive member 10 thermally connects the laser holder 4 to the housing 2. The heat sink 16 is thermally connected to the housing 2 through the thermally conductive grease 9 in order to reduce the temperature rise in the laser element 3. Reference numeral 11 denotes a protrusion for use in connection to the laser holder and same protrusion are provided to the thermally conductive member 10, as mentioned later.

In the first embodiment, the thermally conductive member 10, which thermally connects the laser holder 4 to the housing 2, is engaged with the bottom surface of the housing 2. In the present embodiment, however, a slot 17 (equivalent to the slot 17 shown in FIG. 2 although not shown in FIG. 5) is formed on a lateral surface of the housing 2 to engage with the hook 18 on the thermally conductive member 10. Further, in the present embodiment, the thermally conductive grease 9 is not filled between the laser holder 4 and the heat sink 16.

As described above, the present embodiment is configured so that the thermally conductive member 10 having a high thermal conductivity is thermally connected between the laser holder 4 and the housing 2. Therefore, the heat is readily transferred to the housing 2 so that the temperature rise in the laser element 3 can be reduced. Further, the thermally conductive grease 9 is not filled between the laser holder 4 and the heat sink 16. Furthermore, the thermally conductive member 10 presses the laser holder 4 in the same direction as the direction of laser light emission 13. This makes it possible to inhibit the direction of laser light emission from being tilted by the temperature rise in the laser element 3. As a result, a highly reliable laser light source module can be provided.

Moreover, the thermally conductive member 10 has springness. Therefore, even if the thickness of the adhesive 12 and the position of the laser holder 4 vary when the laser light source module 1 is assembled, the laser holder 4 can be pressed in the direction of laser light emission 13. As a result, the laser light source module 1 can be structured so as to facilitate its assembly.

Third Embodiment

Figure 6:
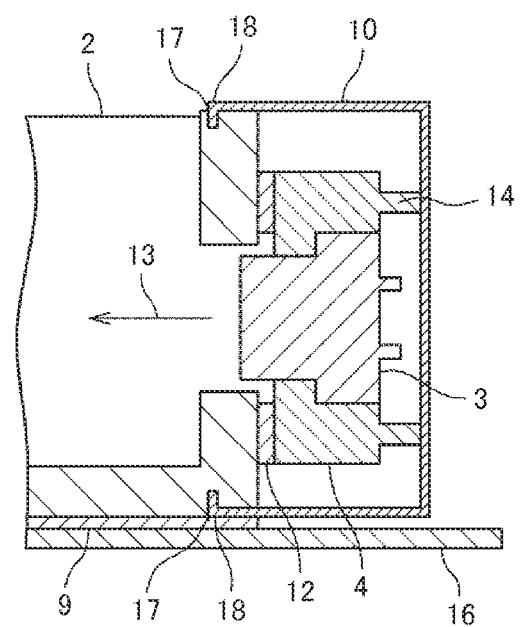
FIG. 6 is a schematic cross-sectional view illustrating the laser holder fixing portion of the laser light source module according to a third embodiment of the present invention.

FIG. 6 is a schematic cross-sectional view illustrating the laser holder fixing portion of the laser light source module according to a third embodiment of the present invention.

Referring to FIG. 6, the third embodiment is similar to the first embodiment in that three laser elements 3, which emit laser beams, are mounted in the laser light source module 1. Each of the three laser elements 3 is hold by the laser holder 4.

The laser holder 4 is fixed to the housing 2 with the adhesive 12. The thermally conductive member 10 thermally connects the laser holder 4 to the housing 2. The heat sink 16 is thermally connected to the housing 2 through the thermally conductive grease 9 in order to reduce the temperature rise in the laser element 3.

In the first and second embodiments, the protrusions are formed on the thermally conductive member 10. In the present embodiment, however, a protrusion 14 is formed on the laser holder 4.

In the present embodiment, the thermally conductive member 10 presses the protrusion 14 on the laser holder so that the heat is readily transferred to the housing 2. This makes it possible to reduce the temperature rise in the laser element 3. Further, as the thermally conductive member 10 is provided, the thermally conductive grease 9 need not be filled between the laser holder 4 and the heat sink 16. Therefore, the thermally conductive member 10 presses the laser holder 4 in the same direction as the direction of laser light emission 13. Hence, it is possible to inhibit the direction of laser light emission from being tilted by the temperature rise in the laser element 3. As a result, a highly reliable laser light source module can be provided.

Fourth Embodiment

Figure 7:
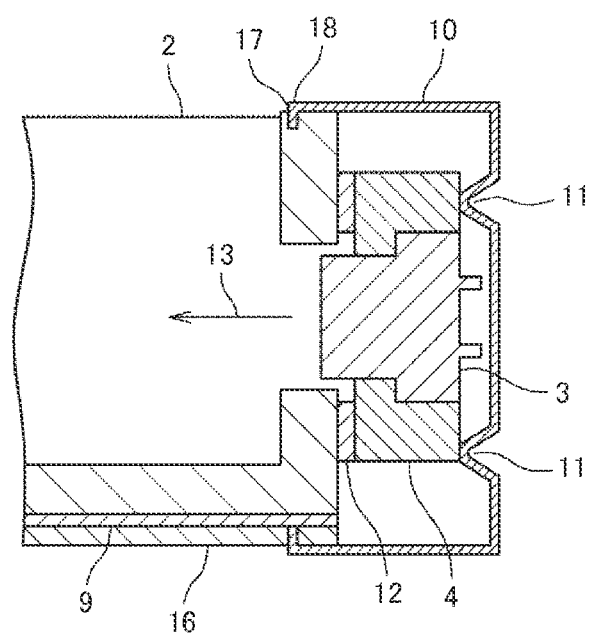
FIG. 7 is a schematic cross-sectional view illustrating the laser holder fixing portion of the laser light source module according to a fourth embodiment of the present invention.

FIG. 7 is a schematic cross-sectional view illustrating the laser holder fixing portion of the laser light source module according to a fourth embodiment of the present invention.

Referring to FIG. 7, the fourth embodiment is similar to the first embodiment in that three laser elements 3, which emit laser light, are mounted in the laser light source module 1. Each of the three laser elements 3 is hold by the laser holder 4.

The laser holder 4 is fixed to the housing 2 with the adhesive 12. The thermally conductive member 10 thermally connects the laser holder 4 to the housing 2. The heat sink 16 is thermally connected to the housing 2 through the thermally conductive grease 9 in order to reduce the temperature rise in the laser element 3.

In the first, second, and third embodiments, both ends of the thermally conductive member 10 is engaged with the housing 2. In the present embodiment, however, one end of the thermally conductive member 10 is engaged with the heat sink 16.

Hence, the present embodiment makes it possible to directly transfer the heat to the heat sink 16 through the thermally conductive member 10 having a high thermal conductivity. Therefore, when compared to the first embodiment, the present embodiment produces better heat dissipation effect and further reduces the temperature rise in the laser element 3.

In addition, as the thermally conductive member 10 is provided, the thermally conductive grease 9 need not be filled between the laser holder 4 and the heat sink 16. Hence, the thermally conductive member 10 presses the laser holder 4 in the same direction as the direction of laser light emission 13. Thus, it is possible to inhibit the direction of laser light emission from being tilted by the temperature rise in the laser element 3. As a result, a highly reliable laser light source module can be provided.

As described above, the foregoing embodiments of the present invention are configured so that the thermally conductive member presses the laser element in the direction of laser light emission. Therefore, the heat generated by the laser element can be transferred from the metal laser holder to the housing through the thermally conductive member having a high thermal conductivity. This makes it possible to avoid an excessive temperature rise in the laser element. Further, as the laser holder is pressed in the direction of laser light emission, it is possible to inhibit the direction of laser light emission from being tilted. This makes it possible to display a high-quality image.

What is claimed is:

1. A laser light source module comprising:
   a housing including:
      a laser element that emits laser light;
      a laser holder that is made of metal to hold the laser element;
      a laser light receiving element that receives laser light from the laser element;
      a mirror element that reflects the laser light to scan the laser light on a screen; and
      an optical element that is disposed on an optical axis of the laser light; and
   a heat sink that is thermally connected to the housing;
   wherein the laser holder is thermally connected to the housing through a thermally conductive member having springness;
   wherein the thermally conductive member or the laser holder is provided with a protrusion which is configured to protrude in the same direction as a laser emission direction of the laser light; and
   wherein the protrusion and the springness of the thermally conductive member are used to press the laser holder against the housing in the same direction as the laser light emission direction.

2. The laser light source module according to claim 1, further comprising:
   a hook provided on one end of the thermally conductive member; and
   a slot provided on the housing,
   wherein the hook engages into the slot.

3. A scanning image display device comprising the laser light source module according to claim 2.

4. The laser light source module according to claim 1, wherein one end of the thermally conductive member engages with the heat sink.

5. A scanning image display device comprising the laser light source module according to claim 4.

6. A scanning image display device comprising the laser light source module according to claim 1.

* * * * *